US010256199B2

United States Patent
Elenes et al.

(10) Patent No.: US 10,256,199 B2
(45) Date of Patent: Apr. 9, 2019

(54) INTEGRATED RECEIVER CIRCUIT FOR ELECTROMAGNETIC PULSE DETECTION IN WIRELESS MICROCONTROLLERS

(71) Applicant: Silicon Laboratories Inc., Austin, TX (US)

(72) Inventors: Javier Elenes, Austin, TX (US); Michael Johnson, Austin, TX (US); John Khoury, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 15/644,451

(22) Filed: Jul. 7, 2017

(65) Prior Publication Data

US 2019/0013281 A1    Jan. 10, 2019

(51) Int. Cl.
*H01L 23/00* (2006.01)
*H03G 3/20* (2006.01)

(52) U.S. Cl.
CPC .............. *H01L 23/576* (2013.01); *H03G 3/20* (2013.01); *H03G 2201/307* (2013.01)

(58) Field of Classification Search
CPC .................. H01L 23/57; H01L 23/576; H03G 2201/307; H03G 3/20; H03G 3/30
USPC ........................................ 327/509, 564, 565
See application file for complete search history.

(56) References Cited

U.S. PATENT DOCUMENTS

| 7,428,694 | B2* | 9/2008 | Pistoulet | G01R 31/31719 |
| | | | | 714/724 |
| 8,946,859 | B2* | 2/2015 | Lisart | H01L 21/763 |
| | | | | 257/48 |
| 9,523,737 | B2* | 12/2016 | O'Flynn | G01R 31/31721 |
| 10,013,581 | B2* | 7/2018 | Hershman | G06F 21/75 |
| 2011/0267190 | A1* | 11/2011 | Payson | G06F 21/86 |
| | | | | 340/539.31 |
| 2012/0131673 | A1* | 5/2012 | Caci | G06F 21/86 |
| | | | | 726/23 |
| 2017/0357829 | A1* | 12/2017 | Park | H03K 5/24 |

OTHER PUBLICATIONS

EFM32WG995, Product Data Sheet, Silicon Laboratories Inc, Jun. 2014, 85 pages, EFM32WG995FXX-d0204_Rev1.40, Silicon Laboratories Inc, 400 West Cesar Chavez, Austin, TX 78701 United States.

(Continued)

*Primary Examiner* — William Hernandez
(74) *Attorney, Agent, or Firm* — Polansky & Associates, P.L.L.C.; Paul J. Polansky; Rosalynn M. Smith

(57) ABSTRACT

An integrated circuit includes an energy detection circuit, a switching circuit, and a tamper response circuit. The integrated circuit has an input for receiving a radio frequency (RF) signal, a first output for providing a demodulated signal, and a second output for selectively providing a detect signal. The detect signal is provided in response to detecting that an energy of an internal signal exceeds a first threshold when the integrated circuit is in a secure mode. The switching circuit is used to alternatively switch the input of the energy detection circuit to an RF input terminal in a normal mode and to an internal antenna in a secure mode. The tamper response circuit disables a function of the integrated circuit in response to an activation of the detect signal in the secure mode.

33 Claims, 8 Drawing Sheets

(56) References Cited

OTHER PUBLICATIONS

Ordas, S., et al., "Electronic Fault Injection: the curse of flip-flops," Journal of Cryptographic Engineering, DOI:10.1007/s13389-016-0128-3, Mar. 2016, 16 pages.
Moro, N., et al., "Electromagnetic fault injection: towards a fault model on a 32-bit microcontroller," IEEE, 2013, 12 pages.
Moro, N., et al., "Experimental evaluation of two software countermeasures against fault attacks," IEEE-HOST Symposium, May 2014, 22 pages, Arlington, VA, United States.
Hummel, T., "Exploring Effects of Electromagnetic Fault Injection on a 32-bit High Speed Embedded Device Microprocessor," Master Thesis—EIT ICT Labs Master School, Jul. 27, 2014, 76 pages, Univeristy of Twente, Enschede, Netherlands.
Moro, N., et al., "Formal verication of a software countermeasure against instruction skip attacks," JCEN, Feb. 24, 2014, France, 17 pages.

\* cited by examiner

INTEGRATED RECEIVER CIRCUIT FOR ELECTROMAGNETIC PULSE DETECTION IN WIRELESS MICROCONTROLLERS

FIELD

This disclosure relates generally to security circuitry, and more specifically to tamper protection circuits for secure integrated circuits.

BACKGROUND

Hackers attempt to gain access to cryptographic integrated circuits, such as smart card controllers, in an effort to steal valuable user data, passwords, and the like. One technique hackers use is to inject electrical faults to cause circuits to malfunction in ways that give the hackers access to the memory and other resources of the integrated circuit. Fault injections are a serious threat against secure circuits. There are multiple methods utilized to inject faults within cryptographic circuits. Among the methods are laser, voltage, and electromagnetic (EM) fault injection. Laser fault injection is a popular method due to its high spatial and temporal resolutions. However, the use of laser for fault injection has limitations. An increased number of metal layers for routing signals in a chip, as well as progressive countermeasures increase the inefficiency of laser attacks. Voltage spike injection is also utilized by injecting a voltage spike directly into a substrate of a targeted integrated circuit. Voltage spike injection produces ground bounces or voltage drops with respect to the intensity of the spike. EM fault injection via a targeted electromagnetic pulse is more commonly being utilized for targeted attacks that aim to disrupt logic circuit behavior within integrated circuits.

Two types of EM injection platforms are known to be mounted to induce faults into circuits. The Harmonic EM injection platform produces sine EM waves that can be modulated to produce faults. Harmonic EM injections may disturb the behavior of an internal clock of an integrated circuit, as well as bias a true random number generator. Additionally, EM Pulse (EMP) injection, produced with a high voltage pulse generator and an injector, has been shown to create faults exploitable from a cryptanalysis point of view. EMP injection produces a single but powerful EMP at a desired time and location on a targeted integrated circuit that creates a sudden current flow in the power and ground networks of the targeted integrated circuit, thereby creating voltage drops, ground bounces, and timing faults. Each of these forms of fault injection is difficult to defend against. As devices become smaller and more pervasive in our environment, the susceptibility to security breaches becomes increasingly more important and more difficult to counter.

Figure 1:
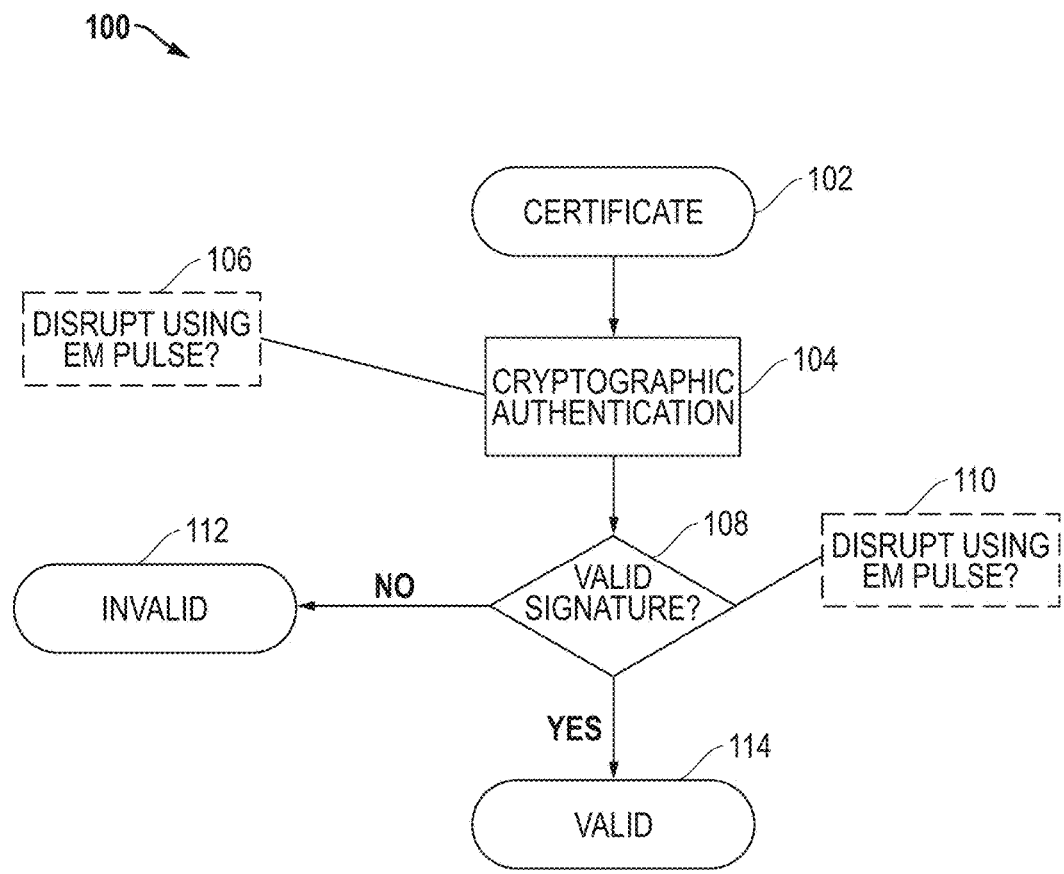
FIG. 1 illustrates a flow diagram of a method for cryptographic authentication of an integrated circuit during an electromagnetic pulse disruption according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

In one form, an integrated circuit includes an energy detection circuit, a switching circuit, and a tamper response circuit. The energy detection circuit has an input for receiving a radio frequency (RF) signal, a first output for providing a demodulated signal, and a second output for selectively providing a detect signal. The detect signal is provided in response to the energy detection circuit detecting that an energy of an internal signal exceeds a first threshold when the energy detection circuit is in a secure mode. The switching circuit alternatively switches the input of the energy detection circuit to an RF input terminal in a normal mode and to an internal antenna in a secure mode. The tamper response circuit is used to disable a function of the integrated circuit in response to an activation of the detect signal in the secure mode.

In still another embodiment, an integrated circuit includes a protected circuit, an energy detection circuit, an antenna, a tamper response circuit, and a protection circuit. The energy detection circuit has an input for receiving an RF signal, a first output for providing a demodulated signal, and a second output for selectively providing a detect signal in response to detecting that an energy of a first internal signal exceeds a first threshold. The tamper response circuit is used for activating a protect signal in response to the detect signal while in a secure authentication mode. The protection circuit is responsive to the protect signal to disable a function of the protected circuit.

FIG. 1 illustrates a flow diagram of a method 100 cryptographic authentication of an integrated circuit during an electromagnetic pulse disruption according to some embodiments. At block 102, a cryptographic certificate is utilized to delegate host firmware development and debug access to an authorized developer. Cryptographic authentication is executed at block 104. At block 106, a fault injection such as an electromagnetic (EM) pulse (EMP) may potentially be applied to the integrated circuit during cryptographic authentication. A fault injection may also be implemented via voltage glitching and clock glitching. A decision is made, at block 108, whether the EMP induces a disruption during validation of the signature. During the process of signature validation, at block 108, a subsequent EMP is applied, at block 110. In response to detecting an EMP of sufficient intensity to disrupt the integrated circuit at either block 106 or 110, the signature is determined to be invalid, and the firmware integrity is protected. In response to the tamper sensor determining the signature is valid, the firmware boot process continues.

Figure 2:
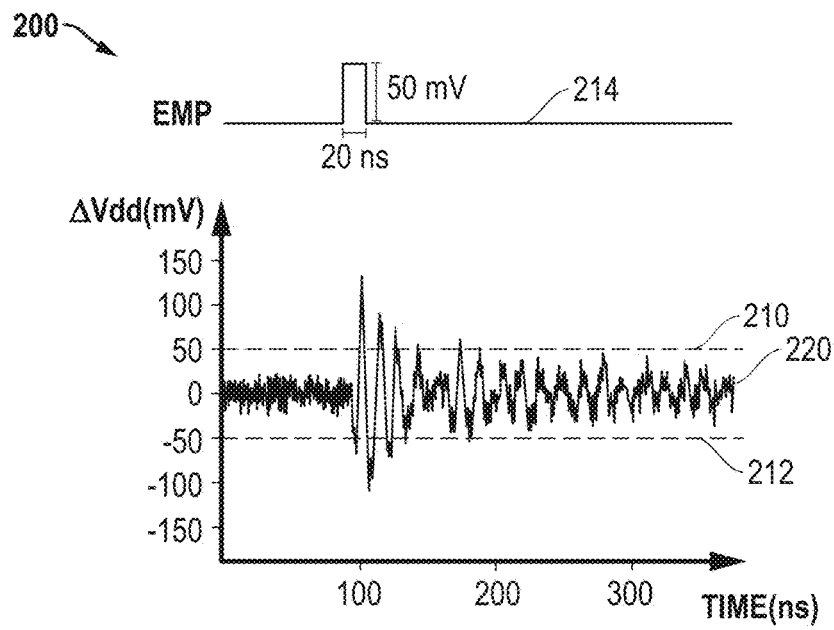
FIG. 2 illustrates a timing diagram of internal voltage oscillations during electromagnetic fault injection for disrupting logic circuit behavior.

FIG. 2 illustrates a timing diagram of internal/localized voltage oscillations during EM fault injection for disrupting logic circuit behavior according to some embodiments. Graph 200 shows a waveform 220 of the deviation of the power supply voltage (AVdd) from its nominal value, threshold 210 and 212. A method for inducing faults in an integrated circuit is using EMP. In the example of FIG. 2, an EMP is injected at around 100 nanoseconds (ns) and causes an oscillation of Vdd. Vdd oscillation causes timing violations when the deviation is outside of predefined limits, where threshold 210 is an upper limit that designates the hold violation limit, and threshold 212 is a lower limit that designates the setup violation limit. The EMP produces timing faults as a result of voltage glitches. Threshold 210 depicts a high Vdd deviation at +50 mV, and a low Vdd deviation of −50 mV. A targeted attack that aims to disrupt logic circuit behavior using an EMP provides a pulse to the integrated circuit device having a tamper sensor. Accordingly, an EMP injection yielding a supply voltage deviation greater than threshold 210 (deviation >50 mV) induces a hold time fault in the tamper sensor. An EMP injection yielding a supply voltage deviation less than threshold 212 (deviation <−50 mV) induces a setup time fault in the tamper sensor.

Figure 3:
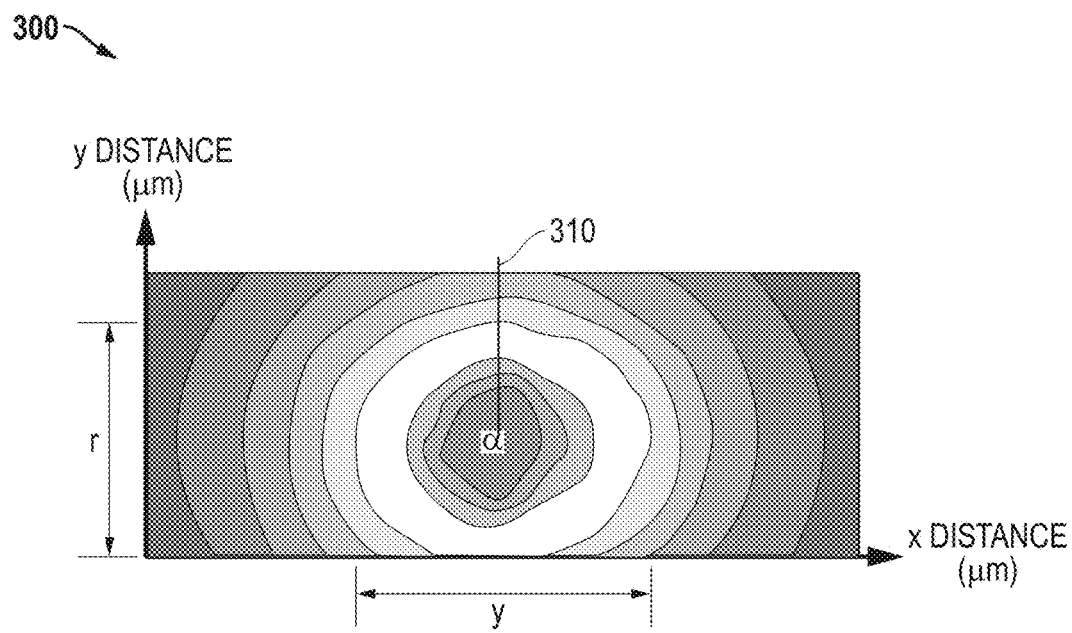
FIG. 3 illustrates a diagram of electromagnetic pulse induced magnetic field in an integrated circuit device.

FIG. 3 illustrates a diagram of EMP induced magnetic field distribution in an integrated circuit device according to some embodiments. Diagram 300 shown an EMP probe 310 in proximity to the active surface of an integrated circuit. In one example, EMP injection generates an intense and sudden variation of the magnetic field in a vicinity close to the targeted device and/or portion of the targeted device. EMP probe 310 has a one-turn, 100 micrometer (μm) in diameter loop and induces a magnetic field in the target device that diminishes as the distance from the injection point increases. The faults induced by EMP probe 310 may be highly localized, as illustrated in diagram 300.

Figure 4:
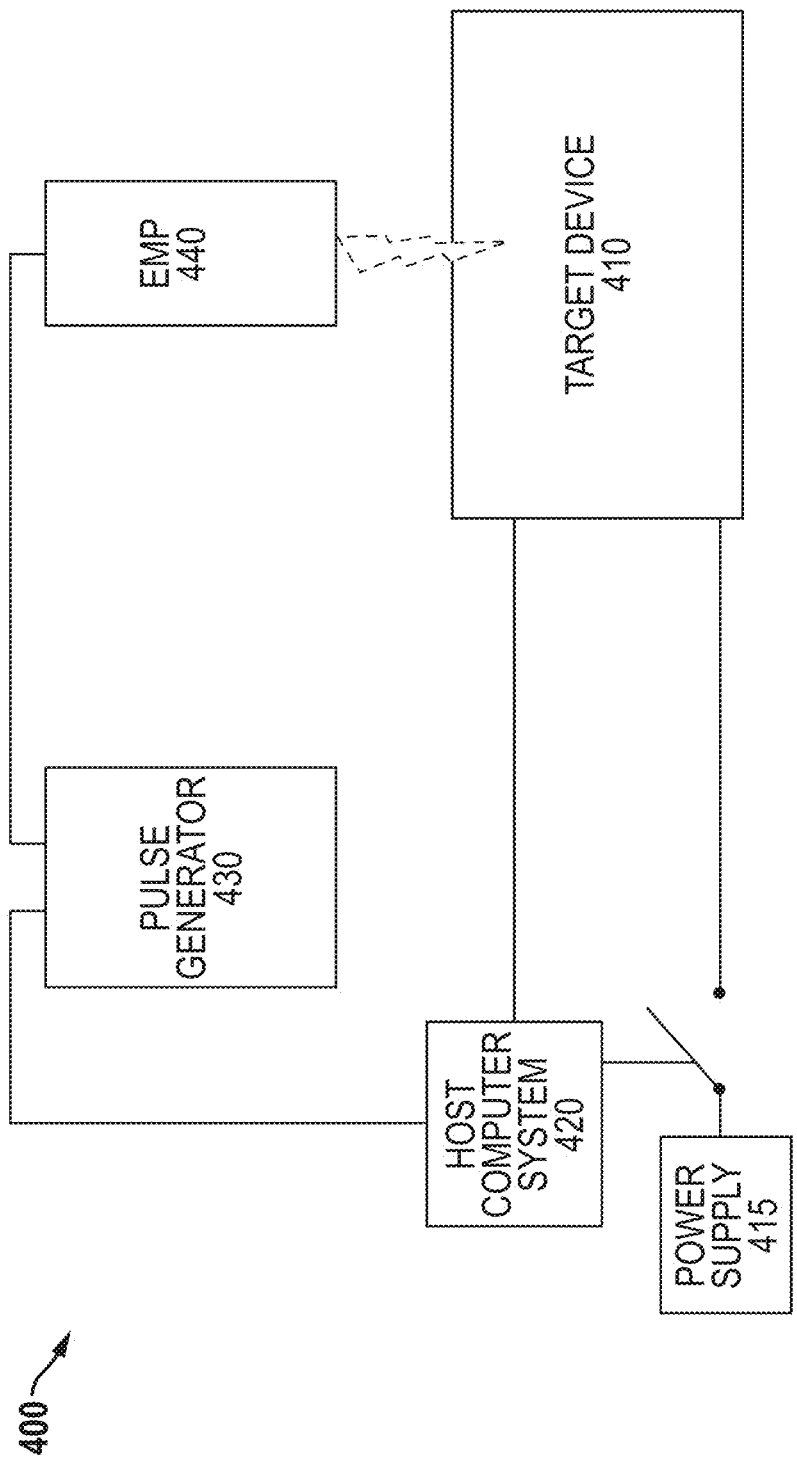
FIG. 4 illustrates in block diagram form an electromagnetic pulse fault injection system that a hacker may use to implement the fault injection of FIG. 3.

FIG. 4 illustrates in block diagram form an EMP fault injection system 400 according to one embodiment that can be used to inject a localized EMP of the type shown in FIG. 3. EMP fault injection system 400 includes a target device 410, a power supply 415, a host computer system 420, a pulse generator 430, and an EMP probe 440. Host computer 420 is connected to power supply 415, pulse generator 430, EMP probe 440, and target device 410.

In one example, host computer 420 executes an EMP sweep on target device 410. Host computer system 420 is utilized to provide invalid boot firmware to target device 410. Pulse generator 430 provides the EMP to EMP probe 440 for injecting the fault to target device 410. EMP probe 440 is a miniaturized EMP injector positioned above target device 410. EMP probe 440 discharges a capacitor bank into a coil upon receiving a pulse from pulse generator 430, thereby creating an EMP. Pulse generator 430 waits a predefined time (glitch offset) and emits a pulse when a trigger signal is asserted by target device 410. Host computer system 420 communicates with target device 410 and monitors the behavior of target device 410. In one example, power supply 415 is an interruptible power supply that enables host computer system 420 to interrupt the power supply to target device 410 to force a reboot of the target device. In another example, power supply 415 is a control input that causes target device 410 to repeat a critical sequence during the boot operation.

A stepper motor is utilized for manipulating target device 410 and/or EMP probe 440. A voltage pulse of a specified amplitude is applied (e.g. voltage: 200 V, current: 8 A) by EMP probe 440 to a localized area for a specified duration (e.g. 5 ns to 100 ns) at the surface of target device 410. Host computer system 420 initiates a glitch sweep of the EMP across the surface of target device 410 to generate a timing fault during boot of target device 410. In one example the sweep is performed at a fixed glitch offset (time) at a predetermined glitch intensity and duration. Initiating at a first location, target device 410 is reset, EMP probe 440 applies the EMP, and host computer system 420 detects a result. EMP probe 440 is stepped to the next location and the process is repeated. Host computer system 420 continues to monitor target device 410 to determine when target device 410 fails to operate properly during the firmware boot authentication operation, allowing host computer system 420 to provide instructions that allow memory on target device 410 to be read and altered.

Figure 5:
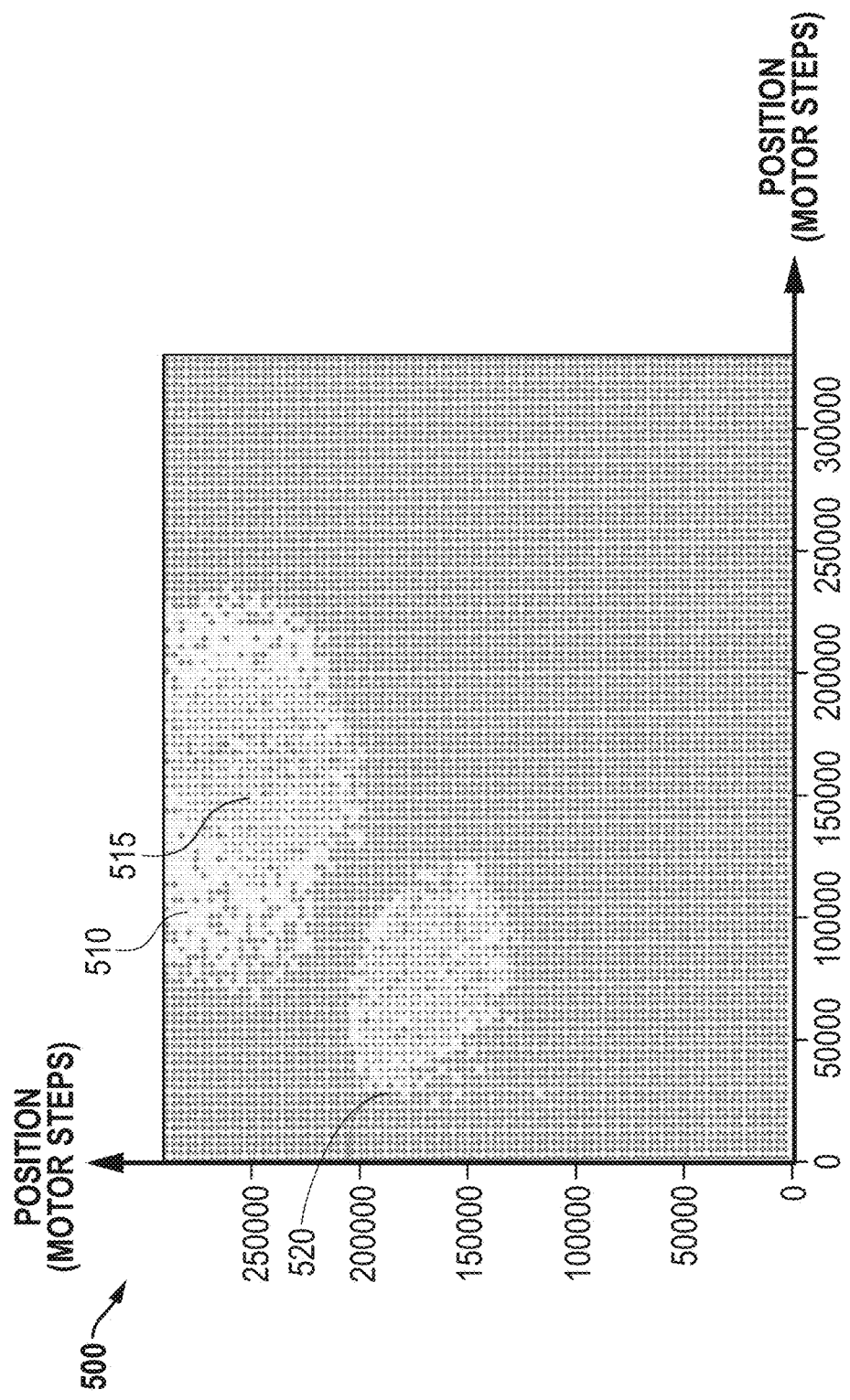
FIG. 5 illustrates in graphical form an electromagnetic fault injection glitch analysis.

FIG. 5 illustrates in graphical form an electromagnetic fault injection glitch analysis according to some embodiments. Graph 500 includes glitch results of area 510, 515, and 520. In one example, a system, similar to FIG. 4 is utilized to provide the glitch analysis of graph 500. A sweep is performed on target device, e.g. a microcomputer having a Cortex-A8 core processor licensed by Advanced RISC Machines, Ltd. of Cambridge, England, running a test program. The goal of the EMP fault injection system (FIG. 4) is to inject a fault at a time from reset, and at a location on the integrated circuit to cause the integrated circuit to fail while executing the authentication operation so that malicious firmware can be provided to the target device. The sweep initiates at a first XY position and continues across the whole surface of the device at a fixed amount of time after reset, known as the "glitch offset". The EMP is set at a fixed intensity and duration. The parameters are applied to the target device until the desired behavior is obtained. Area 510 represents abnormal results which identifies that the EMP injection created a glitch that would enable a hacker to interrupt the authentication process. Area 515 represent a non-answering target, and area 520 represents an expected result was received.

Figure 6:
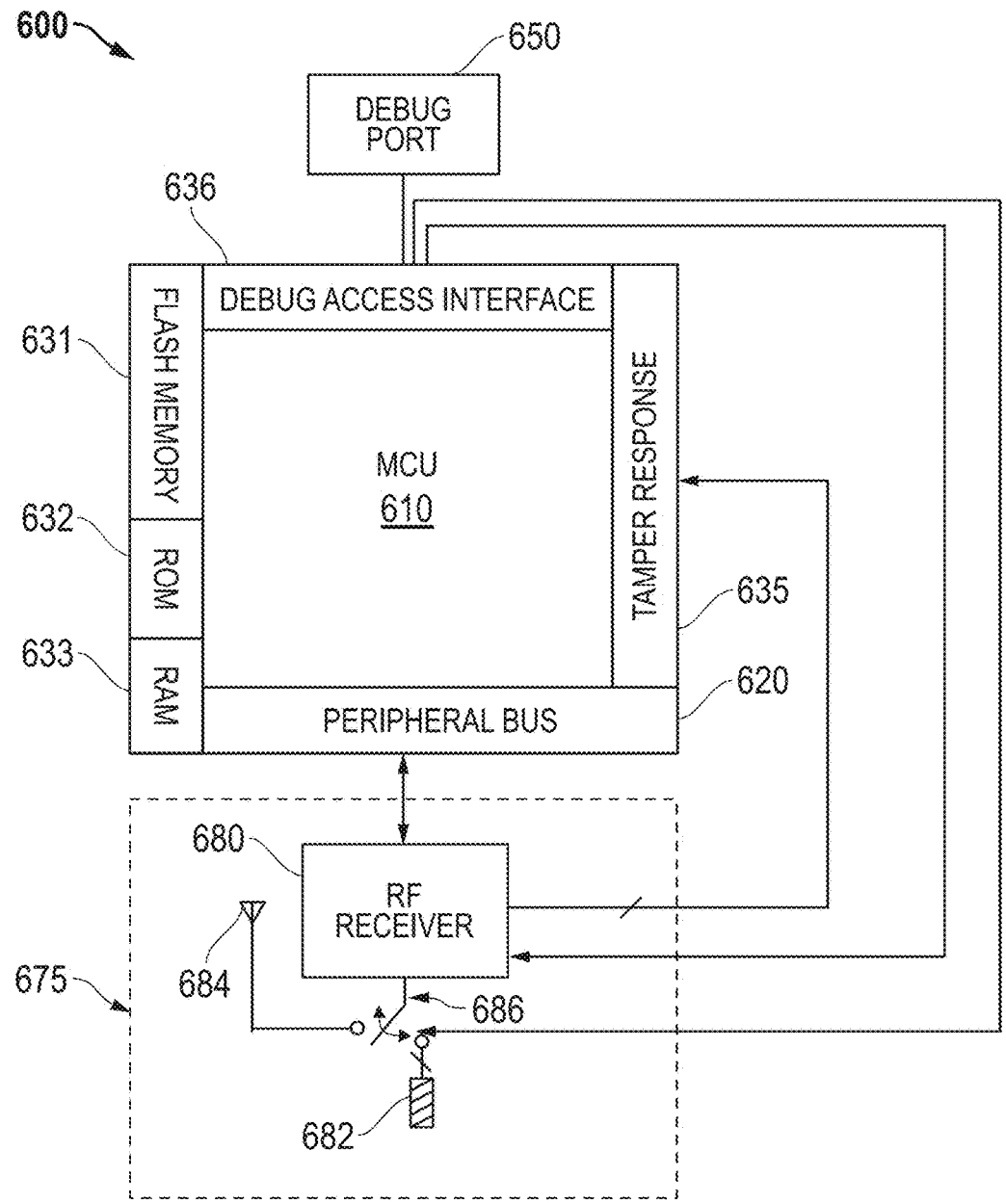
FIG. 6 illustrates in block diagram form an exemplary secure integrated circuit according to some embodiments.

FIG. 6 illustrates in block diagram form an exemplary secure integrated circuit 600 according to some embodiments. Integrated circuit 600 includes a protected circuit that includes microcontroller unit (MCU) 610, peripheral bus interface 620, flash memory 631, read-only memory (ROM) 632, random access memory (RAM) 633, tamper response circuit 635, debug interface circuit 636, debug port 650, and EMP detection circuit 675.

MCU 610 is a processing device connected to ROM 632 and RAM 633. MCU 610 is also connected to peripheral bus interface 620, flash memory 631, tamper response 635, and debug interface circuit 636. ROM 632 is non-volatile memory for storing firmware and data associated with the integrated circuit. RAM 633 is utilized for program data storage. Peripheral bus interface 620 is used to connect peripheral devices to MCU 610. Flash memory 631 is a non-volatile storage medium that retains data in the absence of a power supply, and can be electrically erased and reprogrammed. Blocks of flash memory 631 can be erased, and flash memory 631 can also be erased in whole.

Debug port 650 connects to debug interface circuit 636. Debug interface circuit 636 is an electronic interface that provides access to debug information stored on MCU 610.

Debug port 650 simplifies development and debugging of MCU 610; however, debug port 650 is also utilized by hackers to obtain access to firmware, functionalities, and secret data provided by MCU 610, another processor, a peripheral device, and/or a memory component connected to MCU 610. A host can manage and query a target associated with debug interface circuit 636 via debug port 650. Debug interface circuit 636 only allows MCU debug access if proper cryptographic unlock credentials are provided by the debug port.

Tamper response circuit 635 is connected to debug interface circuit 636, MCU 610, and the memory blocks (flash memory 631, ROM 632, and RAM 633). Tamper response circuit 635 receives a detect signal from EMP detection circuit 675 when it detects an EMP that is characteristic of an attempt to hack integrated circuit 600, and executes a protection operation to secure components of integrated circuit 600 in response to the detect signal. Tamper response circuit 635 selectively issues a response to debug interface circuit 636, MCU 610, or flash memory 631 when a detect signal is received from EMP detection circuit 675, thereby identifying a security disruption to integrated circuit 600.

EMP detection circuit 675 includes a radio frequency (RF) receiver circuit 680, an internal antenna 684, a switching circuit 686, and a RF input terminal 682. Switching circuit 686 switches the input of RF receiver circuit 680 to RF input terminal 682 in a normal mode of operation for integrated circuit 600. In a secure mode of operation, switching circuit 686 switches to internal antenna 684. In response to an EMP fault, RF receiver circuit 680 activates a detect signal and provides the detect signal to tamper response circuit 635. Tamper response circuit 635 disables a function of integrated circuit 600.

In operation, among other functions, integrated circuit 600 provides certain secure functions such as providing storage of secure keys, and providing storage of protected information. Information stored in flash memory 631 is protected by a cryptographic authentication operation. During boot of integrated circuit 600, EMP detection circuit 675 detects a fault injection, and outputs a detect signal to tamper response circuit 635. Tamper response circuit 635 dynamically provides a response to the detect signal. For example, tamper response circuit 635 can reset integrated circuit 600. In another example, tamper response circuit 635 selectively erases sensitive information from integrated circuit 600. In still another example, tamper response circuit 635 enables debug interface 636 to invalidate a cryptographic authentication operation and lock access to debug interface 636. Tamper response circuit 635 erases secrets and/or functions of integrated circuit 600 in response to detection of a fault injection by EMP detection circuit 675 in accordance with a tamper-response policy.

EMP detection circuit 675 detects EMP attacks on integrated circuit 600. More specifically, EMP detection circuit 675 detects when an internal signal, received at internal antenna 684, exceeds a predetermined threshold of power induced by fault injection attacks. Moreover, it leverages an RF receiver circuit that is already present on integrated circuit 600 to detect attempts to hack the circuit by using an EMP when the RF receiver is not needed for other purposes, such as during a secure authentication operation prior to debug or firmware update. Thus, EMP detection circuit 675 provides extra security against attempts to hack the integrated circuit with only a small amount of added circuitry.

Figure 7:
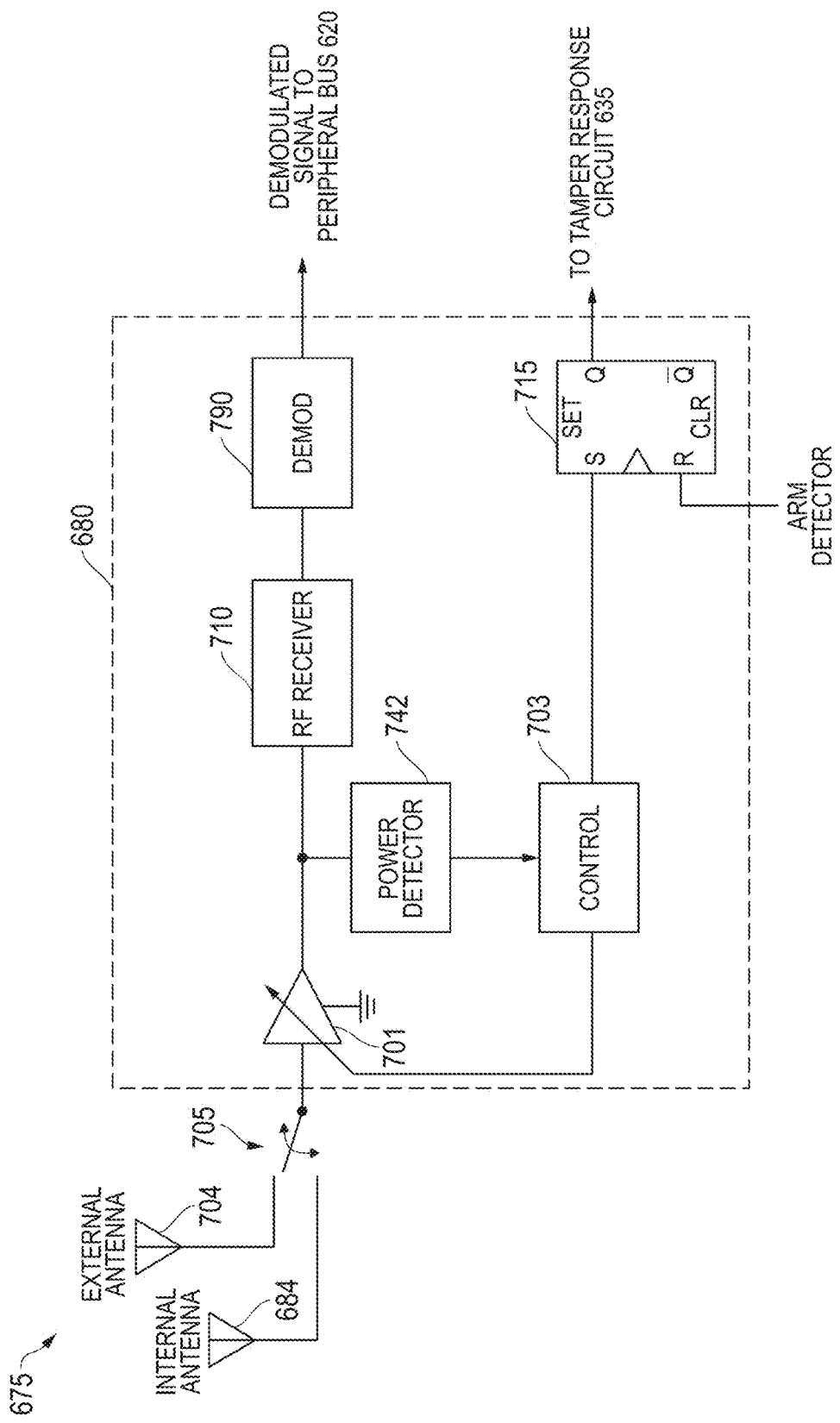
FIG. 7 illustrates in block diagram form an electromagnetic pulse detection circuit according to some embodiments.

FIG. 7 illustrates in block diagram form EMP detection circuit 675 of FIG. 6 according to some embodiments. EMP detection circuit 675 includes internal antenna 684, an external antenna 704, a switching circuit 705, an amplifier 701, a power detector 742, an automatic gain control circuit 703, a register 715, an RF receiver circuit 680, and a demodulator 790. EMP detection circuit 675 has an input for receiving a radio frequency signal from either internal antenna 684 or external antenna 704. Switching circuit 705 is connected to the input of RF receiver circuit 680. Amplifier 701 has an input connected to switching circuit 705 for receiving the input signal, a control input, and an output. Automatic gain control circuit 703 has a first input for receiving the input signal, a first output to amplifier 701, and a second output. The output of amplifier 701 is connected to power detector 742. Power detector 742 has an input for receiving the internal signal and an output. Automatic gain control circuit 703 has an input connected to the output of power detector 742, a first output connected to the control input of amplifier 701, and a second output. Register 715 is a set-reset flip flop having a set input labeled "S" connected to the second output of control circuit 703, a reset input labeled "R" for receiving a signal labeled "ARM DETECTOR", and a Q output connected to tamper response circuit 635 of FIG. 6 for providing the detect signal. RF receiver 710 has an input for receiving the output of amplifier 701, and an output. Demodulator 790 is connected to the output of RF receiver circuit 710.

EMP detection circuit 675 detects when the energy of an internal signal, received at internal antenna 684 exceeds a predetermined threshold. During secure mode operations of integrated circuit 600, EMP detection circuit 675 switches to internal antenna 684, otherwise switch circuit 705 is set to receive signals from external antenna 704. During secure mode, a broadband signal is received at power detector 742. Power detector 742 outputs a peak power of the broadband signal. Automatic gain control circuit 703 reduces the gain of the signal received by RF receiver circuit 680. Automatic gain control circuit 703 compares the peak power of the internal signal to the predetermined threshold. If a fault injection is encountered at EMP detection circuit 675 due the application of an EMP, a voltage glitch exceeds a predetermined peak power threshold automatic gain control circuit triggers the Q of register 715 to register the logic high by initiating the "set" signal of register 715. In response to triggering the Q of register 715, a detect signal is provided to tamper response circuit 635, indicating detection of a fault injection. Responsively, tamper response circuit 635 enables execution of a protection operation. Upon receipt of a signal at the "reset" input of register 715, Q output of register 715 is set to "0", and EMP detection circuit 675 is armed to continue monitoring fault injection.

By detecting that the peak power of the signal from internal antenna 684 exceeds the predetermined peak power threshold, EMP detection circuit 675 reliably detects the application of an EMP, and generates the detect signal to prevent the EMP from disrupting an important operation such as a cryptographic authentication operation and thereby to prevent the integrated circuit from being hacked. Note that amplifier 701, power detector 742, and AGC control circuit 703 form an AGC loop included in RF receiver circuit 680 for use in normal operation mode, and RF receiver circuit 680 is able to detect an EMP received from internal antenna 684 in secure mode with only a very small amount of added hardware. In another embodiment, automatic gain control circuit 703 can monitor the dynamic behavior of the gain applied to the signal received at internal antenna 684. A rapid rate of gain reduction indicates detection of a rising edge of an EMP. Therefore, automatic gain control circuit 703 detects a rising edge of the output of power detector 742 when a rate of gain reduction over time exceeds a gain reduction threshold, thereby triggering the detect signal.

In another embodiment, an integrated circuit without an existing RF receiver could implement the EMP detection mechanism as well. Integrated circuit 600 would include internal antenna 684, but a simple detection circuit replaces RF receiver circuit 680. In one particular embodiment, the detection circuit could be a wideband energy detector implemented with a rectifier followed by a fast attack (filter state increases quickly), slow release (filter state decays slowly) filter. A comparator, such as the comparator of automatic gain control circuit 703 discussed above, would compare the output of the filter to the predetermined threshold. The output of the comparator would then set the state of a register like register 715 to generate the detect signal as discussed above. Thus, the integrated circuit could get the benefits of this EMP detection capability by adding only a detection circuit that is much smaller than RF receiver circuit 680.

Figure 8:
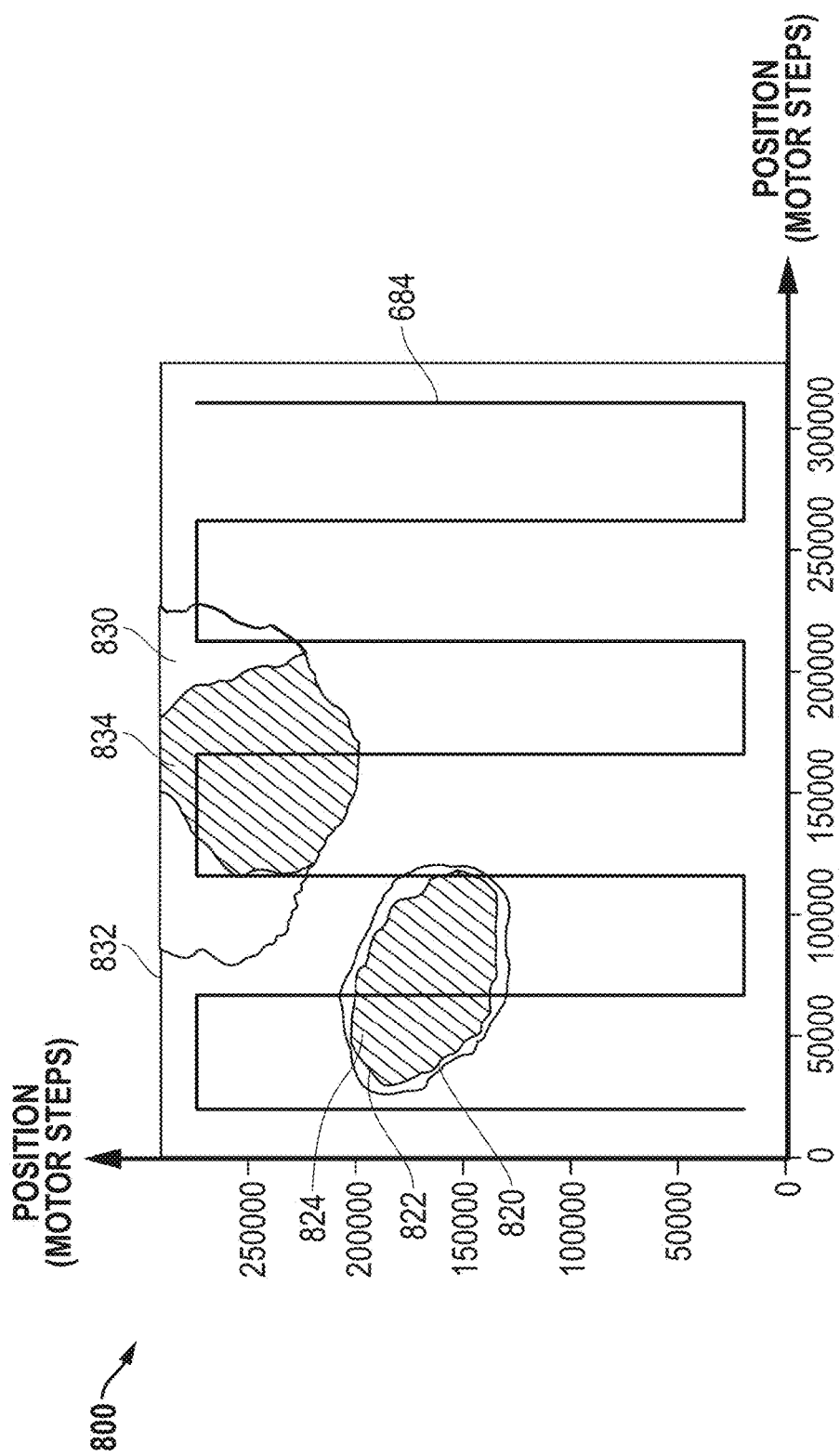
FIG. 8 illustrates in graphical form a superimposed perspective of FIG. 5 and distribution of an antenna of an electromagnetic pulse detection circuit according to some embodiments.

FIG. 8 illustrates in graphical form a superimposed perspective of FIG. 5 and distribution of an antenna of an electromagnetic pulse detection circuit according to some embodiments. Graph 800 includes internal antenna 684, integrated circuit 832, and glitch result 820, 822, 824, 830, and 834. In this embodiment, internal antenna 684 is distributed by less than a predetermined distance related to an expected fault injection area throughout integrated circuit 832. The network of tamper sensors formed enable detection of glitch result 820, 822, 824, 830, and 834 resulting from the fault injection analysis illustrated in FIG. 5.

Figure 9:
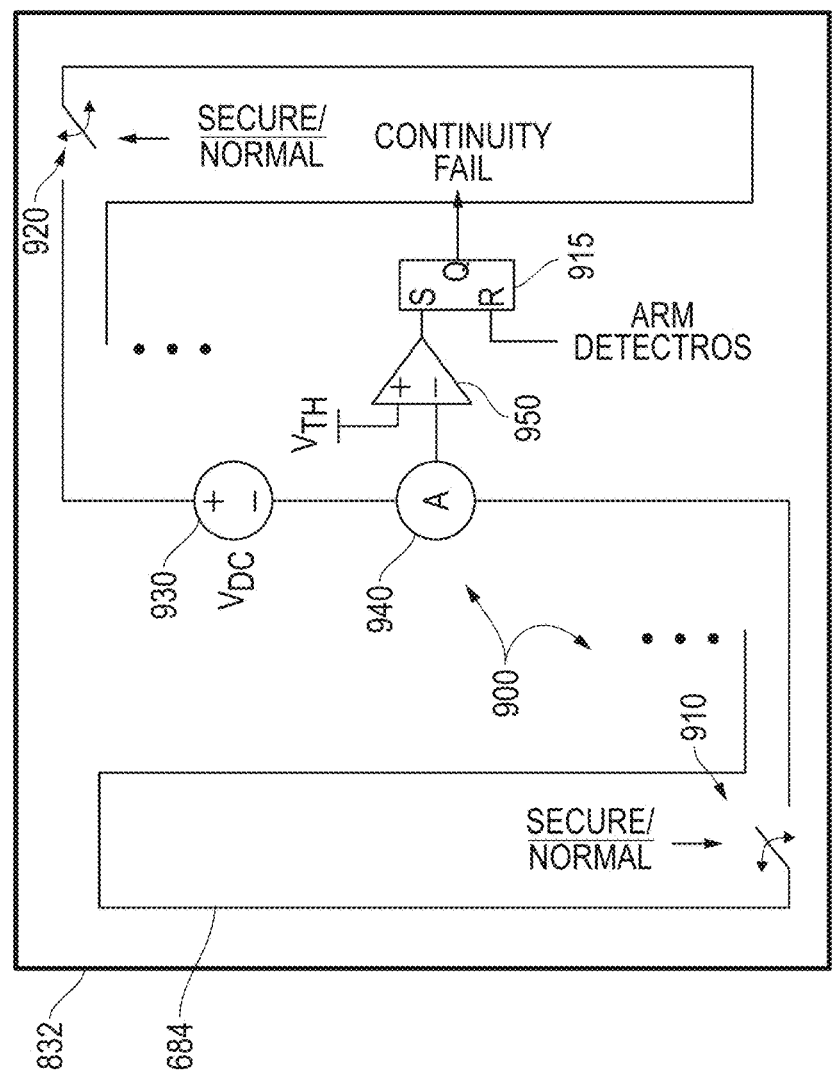
FIG. 9 illustrates in block diagram form a distribution of an antenna and an electromagnetic pulse detection circuit on an integrated circuit layout according to some embodiments.

FIG. 9 illustrates in block diagram form integrated circuit 832 of FIG. 8 having internal antenna 684 and a continuity check circuit 900 for use with internal antenna 684. Continuity check circuit 900 includes internal antenna 684, switches 910 and 920, a register 915, a voltage source 930, an ammeter 940, and a comparator 950. As shown in FIG. 8, internal antenna 684 is configured in a serpentine pattern on integrated circuit 832. Continuity check circuit 900 is positioned between the first and second ends of internal antenna 684.

In secure mode, switches 910 and 920 connect continuity circuit 900 to the two ends of internal antenna 684. Continuity circuit 900 detects tampering with internal antenna 684 when internal antenna 684 fails to conduct a sufficient amount of current from one end to the other end. Ammeter 940 measures the current through internal antenna 684 when voltage source 930 is connected in series between the two ends of internal antenna 684. To prevent a virtual short, voltage source 930 has a high internal resistance to limit its output current. Comparator 950 receives a voltage from ammeter 940 that is representative of the amount of current flowing through internal antenna 684. Comparator 950 compares the output of ammeter 940 to a threshold voltage labeled "$V_{TH}$". When the output of ammeter 940 falls below $V_{TH}$, the output of comparator 950 goes high and sets register 915. Therefore, if internal antenna 684 is disrupted (e.g., cut, tampered with, removed, or destroyed), the current through ammeter 940 is also interrupted, thereby causing a logic "1" to be provided to the "set" input of register 915. Providing a logic "1" to register 915 triggers the output of register 915 to be set to "high", causing register 915 to provide a signal labeled "CONTINUITY FAIL" to tamper response circuit 635. Thus, the secure integrated circuit not only includes an internal antenna connected to an input to an existing RF receiver to detect a high-energy EMP, but it also detects a loss of continuity in the internal antenna that results from attempts to defeat the internal EMP detection mechanism.

In one particular embodiment, an integrated circuit with continuity circuit can be manufactured as follows. First, the integrated circuit is laid out to form a layout such as integrated circuit layout 832. Generally, an integrated circuit designer provides a netlist for the integrated circuit to a commercially available place-and-route tool, which automatically lays out the electronic components in the integrated circuit to meet timing requirements. However, the designer indicates the desired location of internal antenna 684 to the place-and-route tool. The method includes defining a route for internal antenna 684 such that all points on integrated circuit 600 are within a predetermined distance of internal antenna 684. The method includes connecting an input from tamper response circuit 635 to the reset input of register 915 and register 715. The method includes distributing internal antenna 684 in a serpentine pattern on integrated circuit 600, and placing continuity circuit 900 between the first and second ends of internal antenna 684. The method includes connecting outputs of continuity circuit 900 and EMP detection circuit 675 to tamper response circuit 635.

Second, the integrated circuit is fabricated according to the layout. The fabrication can be performed using conventional integrated circuit fabrication processes for complementary metal-oxide-semiconductor (CMOS) chips. The fabrication process includes steps such as doping the semiconductor wafer to form active regions of transistors, patterning and etching gate electrodes and electrical interconnects, polishing various layers for planarization, testing the completed integrated circuit die, packaging the integrated circuit die in integrated circuit packages for mounting onto printed circuit boards, and the like.

The above-disclosed subject matter is to be considered illustrative, and not restrictive, and the appended claims are intended to cover all such modifications, enhancements, and other embodiments that fall within the true scope of the claims. In one embodiment, a basic tamper sensor circuit includes a hold time violation detection circuit and a setup time violation detection circuit. Each circuit respectively detects the respective fault injection triggering either a low hold time violation or a low setup time violation. In one example, setup time and hold time violation circuits are randomly distributed on an integrated circuit. In another example, setup time and hold time violation circuits are strategically placed to secure a specified element on an integrated circuit. In an alternative embodiment, the tamper sensor circuit includes paired clusters of setup time and hold time violation circuits. In still, another embodiment, the tamper sensor circuit utilizes quad clusters. Thus, to the maximum extent allowed by law, the scope of the present invention is to be determined by the broadest permissible interpretation of the following claims and their equivalents, and shall not be restricted or limited by the foregoing detailed description.

What is claimed is:
1. An integrated circuit comprising:
an energy detection circuit having an input for receiving a radio frequency (RF) signal, a first output for providing a demodulated signal, and a second output for selectively providing a detect signal in response to detecting that an energy of an internal signal exceeds a first threshold in a secure mode;

a switching circuit for alternatively switching said input of said energy detection circuit to an RF input terminal in a normal mode and to an internal antenna in said secure mode; and a tamper response circuit for disabling a function of the integrated circuit in response to an activation of said detect signal in said secure mode.

2. The integrated circuit of claim 1, wherein said energy detection circuit detects that said energy of said internal signal exceeds said first threshold by comparing a power of said internal signal to said first threshold using an automatic gain control circuit.

3. The integrated circuit of claim 2, wherein said energy detection circuit further comprises:
an amplifier having a positive input coupled to said switching circuit, a control input, and an output for providing said internal signal;
a power detector having an input for receiving said internal signal, and an output for providing a peak power of said internal signal;
said automatic gain control circuit having a first input for receiving said peak power of said internal signal, a first output coupled to said control input of said amplifier, and a second output; and
a register having an output for providing said detect signal that is set in response to an activation of said second output of said automatic gain control circuit, and reset in response to an arm detector signal.

4. The integrated circuit of claim 3, wherein said automatic gain control circuit detects that said energy of said internal signal exceeds said first threshold by comparing said peak power of said internal signal to said first threshold.

5. The integrated circuit of claim 3, wherein said automatic gain control circuit:
monitors a dynamic behavior of gain when said gain is applied to said internal signal; and
responsively, detects an increase in power of said internal signal when a reduction in a rate of gain, over time, exceeds a gain reduction threshold.

6. The integrated circuit of claim 1, wherein said energy detection circuit further comprises:
an RF receiver having an input for receiving said RF signal; and
a demodulator circuit for providing said demodulated signal.

7. The integrated circuit of claim 1, further comprises:
a continuity check circuit coupled to first and second ends of said internal antenna for selectively providing a continuity fail signal in response to detecting a break in continuity of said internal antenna; and
wherein said tamper response circuit disables said function further in response to said continuity fail signal.

8. The integrated circuit of claim 1 wherein said internal antenna is routed on the integrated circuit such that all points on the integrated circuit are within a predetermined distance of said internal antenna.

9. The integrated circuit of claim 8 wherein said internal antenna is routed in a serpentine pattern on the integrated circuit.

10. The integrated circuit of claim 1, wherein said tamper response circuit places said switching circuit into said secure mode in response to an authentication operation.

11. The integrated circuit of claim 1, wherein said tamper response circuit places said switching circuit into said secure mode in response to a debug interface operation.

12. An integrated circuit comprising:
a protected circuit;
an antenna for receiving an RF signal;
an energy detection circuit having an input coupled to said antenna, a first output for providing a demodulated signal, and a second output for selectively providing a detect signal in response to detecting that an energy of a first internal signal exceeds a first threshold;
a tamper response circuit for activating a protect signal in response to said detect signal while in a secure authentication mode; and
a protection circuit responsive to said protect signal to disable a function of said protected circuit.

13. The integrated circuit of claim 12, wherein said energy detection circuit detects that said energy of said first internal signal exceeds said first threshold by comparing a peak power of said first internal signal to said first threshold using an automatic gain control circuit.

14. The integrated circuit of claim 13, wherein said energy detection circuit further comprises:
an amplifier having a positive input coupled to a switch, a control input, and an output for providing said first internal signal;
a power detector having an input for receiving said first internal signal, and an output for providing said peak power of said first internal signal;
said automatic gain control circuit having a first input for receiving said peak power of said first internal signal, a first output coupled to said control input of said amplifier, and a second output; and
a register having an output for providing said detect signal that is set in response to an activation of said second output of said automatic gain control circuit, and reset in response to an arm detector signal.

15. The integrated circuit of claim 14, wherein said energy detection circuit further comprises:
an RF input terminal;
said switch for coupling said input of said energy detection circuit to said RF input terminal in a normal operation mode and to said antenna in said secure authentication mode; and
said tamper response circuit for selectively placing said switch into said secure authentication mode.

16. The integrated circuit of claim 15, wherein said tamper response circuit places said switch into said secure authentication mode in response to an authentication request.

17. The integrated circuit of claim 15, wherein said tamper response circuit places said switch into said secure authentication mode in response to initiation of a debug interface operation.

18. The integrated circuit of claim 13, wherein said automatic gain control circuit detects that said energy of said first internal signal exceeds said first threshold by comparing said peak power of said first internal signal to said first threshold using a power detector.

19. The integrated circuit of claim 13, wherein said automatic gain control circuit:
monitors a dynamic behavior of a gain when said gain is applied to said first internal signal; and
responsively, detects an increase in power of said first internal signal when a reduction in a rate of gain, over time, exceeds a gain reduction threshold.

20. The integrated circuit of claim 12, wherein said energy detection circuit selectively provides said detect signal in response to detecting that an energy of any one of a plurality of internal signals exceeds a respective threshold.

21. The integrated circuit of claim 12, further comprising:
a continuity check circuit coupled to first and second ends of said antenna for selectively providing a continuity fail signal in response to detecting a break in continuity of said antenna; and
wherein said tamper response circuit further provides said protect signal further in response to said continuity fail signal.

22. The integrated circuit of claim 21, wherein said antenna is routed on the integrated circuit such that all points on the integrated circuit are within a predetermined distance of said antenna.

23. The integrated circuit of claim 21 wherein said antenna is routed in a serpentine pattern on the integrated circuit.

24. The integrated circuit of claim 12 wherein said energy detection circuit provides said demodulated signal to said protected circuit in response to said RF signal in a normal operation mode.

25. A method for protecting an integrated circuit from tampering, comprising:
in a normal operation mode:
switching an input of a radio frequency receiver to an RF input terminal of the integrated circuit;
receiving an RF input signal at said RF input terminal using said RF receiver; and
demodulating said RF input signal received at said RF input terminal, and
in a secure authentication mode:
switching said input of said RF receiver to an antenna on the integrated circuit;
detecting that an energy of a first internal signal of said RF receiver exceeds a first threshold;
providing a detect signal in response to said detecting; and
disabling a function of the integrated circuit in response to an activation of said detect signal.

26. The method of claim 25, wherein said disabling said function comprises an authentication operation.

27. The method of claim 25, wherein said disabling said function comprises a debug operation.

28. The method of claim 25, wherein said detecting comprises comparing a power of said first internal signal to said first threshold using an automatic gain control circuit.

29. The method of claim 25, wherein said detecting comprises comparing a peak power of said first internal signal to said first threshold using a power detector.

30. The method of claim 25, wherein said detecting comprises detecting that an energy of any one of a plurality of internal signals exceeds a respective threshold.

31. The method of claim 25, further comprising:
checking a continuity between first and second ends of said antenna;
selectively providing a continuity fail signal in response to detecting a break in continuity of said antenna; and
disabling said function of the integrated circuit in response to an activation of said continuity fail signal.

32. The method of claim 25, wherein said switching said input of said RF receiver to said antenna comprises switching said input of said RF receiver to an internal antenna that is routed on the integrated circuit such that all points on the integrated circuit are within a predetermined distance of said antenna.

33. The method of claim 25, wherein said switching said input of said RF receiver to said antenna comprises switching said input of said RF receiver to an internal antenna having a serpentine pattern on the integrated circuit.

* * * * *